United States Patent [19]

Young

[11] 4,040,029

[45] Aug. 2, 1977

[54] MEMORY SYSTEM WITH REDUCED BLOCK DECODING

[75] Inventor: Alexander Wilson Young, High Bridge, N.J.

[73] Assignee: RCA Corporation, New York, N.Y.

[21] Appl. No.: 688,576

[22] Filed: May 21, 1976

[51] Int. Cl.[2] .................... G06F 13/00; G11C 7/00
[52] U.S. Cl. .................... 364/900; 340/173 R
[58] Field of Search ......... 340/172.5, 173 SP, 173 R; 445/1

[56] References Cited

U.S. PATENT DOCUMENTS

| | | | |
|---|---|---|---|
| 3,613,055 | 10/1971 | Varadi et al. | 340/173 SP |
| 3,659,275 | 4/1972 | Marshall | 340/173 R |
| 3,665,426 | 5/1972 | Gross et al. | 340/173 SP |
| 3,740,723 | 6/1973 | Beausoleil et al. | 340/172.5 |
| 3,753,242 | 8/1973 | Townsend | 340/172.5 |
| 3,821,715 | 6/1974 | Hoff, Jr. et al. | 340/172.5 |
| 3,855,580 | 12/1974 | Lighthall et al. | 340/173 R |
| 3,936,812 | 2/1976 | Cox et al. | 340/173 R |
| 3,976,976 | 8/1976 | Khosharian | 340/172.5 |
| 3,983,544 | 9/1976 | Dennison et al. | 340/173 R |
| B 506,839 | 3/1976 | Penzel | 340/172.5 |

OTHER PUBLICATIONS

W. J. Patzer, "Flexible Read-Only Read/Write Memory Partiton" in *IBM Technical Disclosure Bulletin;* vol. 15, No. 8, Jan. 1973; pp. 2397-2398.

M. E. Houdek, "Read-Only Patch Card" in *IBM Technical Disclosure Bulletin;* vol. 17, No. 6, Nov. 1974; pp. 1742-1743.

*Primary Examiner*—Melvin B. Chapnick
*Attorney, Agent, or Firm*—H. Christoffersen; S. Cohen; Carl M. Wright

[57] ABSTRACT

Memory module construction including separate internal block decoders and system for utilization. Some of the memory modules in a multi-module memory system include a block address decoder providing an external signal when the corresponding module is addressed. A gate, responsive to the external signals, enables the memory modules which do not include a block address decoder. If more than one memory module do not include a block address decoder, then certain address lines or special control lines, in conjunction with the gate, select which memory module is to be enabled.

3 Claims, 5 Drawing Figures

MEMORY SYSTEM WITH REDUCED BLOCK DECODING

BACKGROUND OF THE INVENTION

Microprocessors used in dedicated systems usually employ Read Only Memories to store the controlling program. Usually more than one such memory module is required to store the fixed programs and values of constants used by the program. A single random access memory module is usually sufficient to store the variable data used by the system. The use of several modules, each storing a block of data, requires block decoding for each module. This block decoding requirement increases the number of logic devices needed to implement a given system. A fixed decoder, separate from the memory module, requires that the associated memory module occupy a certain physical position in the system, viz., the location to which the decoder output signal is provided.

Unless certain combinations of block sizes are used, there will be discontinuities in the valid address structure. That is, there may be invalid addresses within the range of the permitted addresses. This is explained in more detail below.

The invention set forth in this application describes a memory organization which reduces the number of devices required and permits some flexibility in the physical positioning of the Read Only Memories. No address discontinuities occur in the embodiment according to the invention.

BRIEF SUMMARY OF THE INVENTION

A memory module, responsive to a word address which specifies a word to be retrieved, includes a block address decoder responsive to a block address for enabling the output gating of the memory module and for producing the enabling signal externally from the memory module. A system comprising several memory modules, each including a word address decoder, also includes—except for one of the memory modules—a block address decoder. When none of the memory modules having a block decoder is addressed, a gate, which is responsive to the output signals from the block decoders, enables the memory module not having a block decoder.

DETAILED DESCRIPTION OF THE INVENTION

Figure 1:
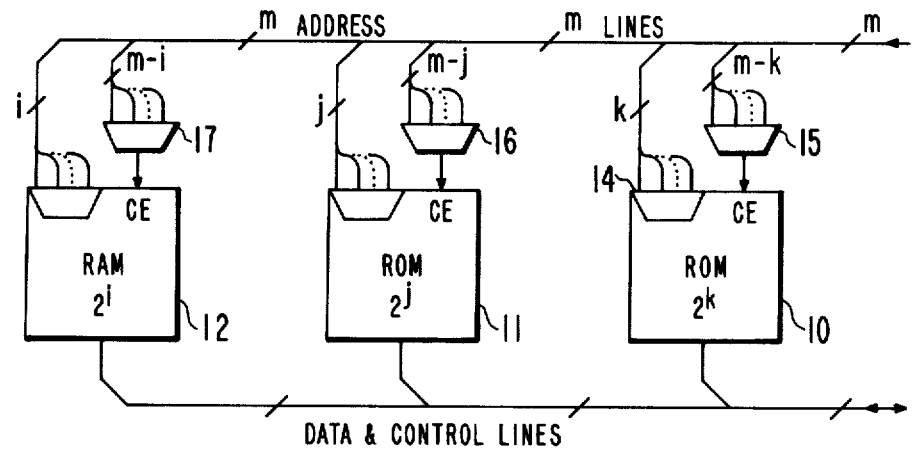
FIG. 1 is a block diagram of a prior art memory system.

FIG. 1 is an illustration of a typical memory organization used with a microprocessor. Two Read Only Memories (ROM's) 10 and 11 might be used store fixed programs and values of constants. A Random Access Memory (RAM) 12 might be used to store occasional programs and variable data or to act as a buffer between input and output devices.

In the illustrated system, the number of address lines is assumed to be $m$ so that $2^m$ words—a word refers to the number of bits stored at an address—can be addressed.

Each memory module is shown as having a capacity different from the other two for purposes of illustration. The ROM 10 stores $2^k$ words. Therefore, the $k$ least significant address lines are coupled to the ROM's (or modules's) internal word address decoder 14. The ROM 11 requires the $j$ least significant address lines to be coupled to its word address decoder. The most significant address lines must be decoded to distinguish the word addressed in the ROM 10 from the word addressed in the ROM 11, because the $j$ address lines are a subset of the $k$ address lines, or vice versa. That is, a word will be addressed in each ROM 10 and 11, but the block address bits indicate which is selected.

For the ROM 10, a block address decoder 15 produces an output signal in response to a matching value of the ($m$-$k$) block address lines at its input nodes. The output signal from the block address decoder 15 enables the ROM 10 via a CE (chip enable) terminal. If the more significant address lines indicate that the addressed word is in the ROM 11, a block address decoder 16 is activated to enable the ROM 11.

In a similar manner, the RAM 12 is addressed via $i$ word address lines and ($m$-$i$) block address lines.

In general, each ROM or RAM is referred to as a module. Some modules may comprise several memory IC's (integrated circuits) depending on the width of the system memory word, i.e., the number of bits in a word and on the width of the word in each IC. For example, a commercially available RAM type 2102 (Intel Corp.) is a 1024 × 1 memory IC which means that it stores 1024 words, each of which is one bit wide. If the memory system word is eight bits wide, i.e., a byte, then eight type 2102 IC's would be coupled in parallel, except for the data terminals. Since there are 1024 words in the module, 10 address lines ($2^{10}$ = 1024) must be coupled to the internal word address decoder; in this example, pins 1-2, 4-8, and 14-16 are access to the word address decoder of the type 2102. For purposes of this invention, a module is considered an integrated circuit. Assuming that the system uses 16 address lines ($m$=16), then the six most significant address lines would be coupled to the input terminals of a decoder, which, in this example, can be a six-input NAND gate. The NAND gate or decoder output signal would be coupled to pin 13 of the type 2102. The chip enable signal of the type 2102 must be a low to enable the memory. Some of the most significant six address lines may require inverters, depending on the block address.

The blocks, i.e., the number of words in a module, are not always the same for each module. Consequently, some addresses cannot be used by the system. For example, using $m$=16, $j$=9, and $k$=10, then the ROM 10 of FIG. 1 would store 1024 words. These will be assumed to be the first 1024 words addressed by the system. The block decoder 15 would be responsive to all logical zeroes, i.e., address lines $2^{15}$ through $2^{10}$, each having a logical zero value would activate the ROM 10 for binary address 000000XXXXXXXXXX, where the X's denote 'don't care' values because they are decoded by the word address decoder 14 in the ROM 10.

Since $j$=9, the ROM 11 stores $2^9$, or 512 words. The block decoder 16 must be responsive to the seven most significant address lines which cannot be all zeroes since this would be included in a valid address for the ROM 10. Likewise, the block address for the ROM 11 cannot be 0000001 because this is also included in the valid address range for the ROM 10 when the most significant (address line 29) is a logical one. Therefore, the block address for the ROM 11 must be 0000010 or 0000011, but it cannot be both. If the value of $i$ is not also 9, then blocks addressed by 0000010 in ROM 11 will preclude words having an address 0000011XXXXXXXXX. Similarly, if the ROM 11 block address is 0000011, then words addressed by 0000010XXXXXXXXX cannot be used.

In the prior art system shown in FIG. 1, the RAM 12 also requires a block decoder 17. Such a prior art system requires that the modules occupy specific physical locations on the printed circuit boards or connection media used in its construction.

Figure 2:
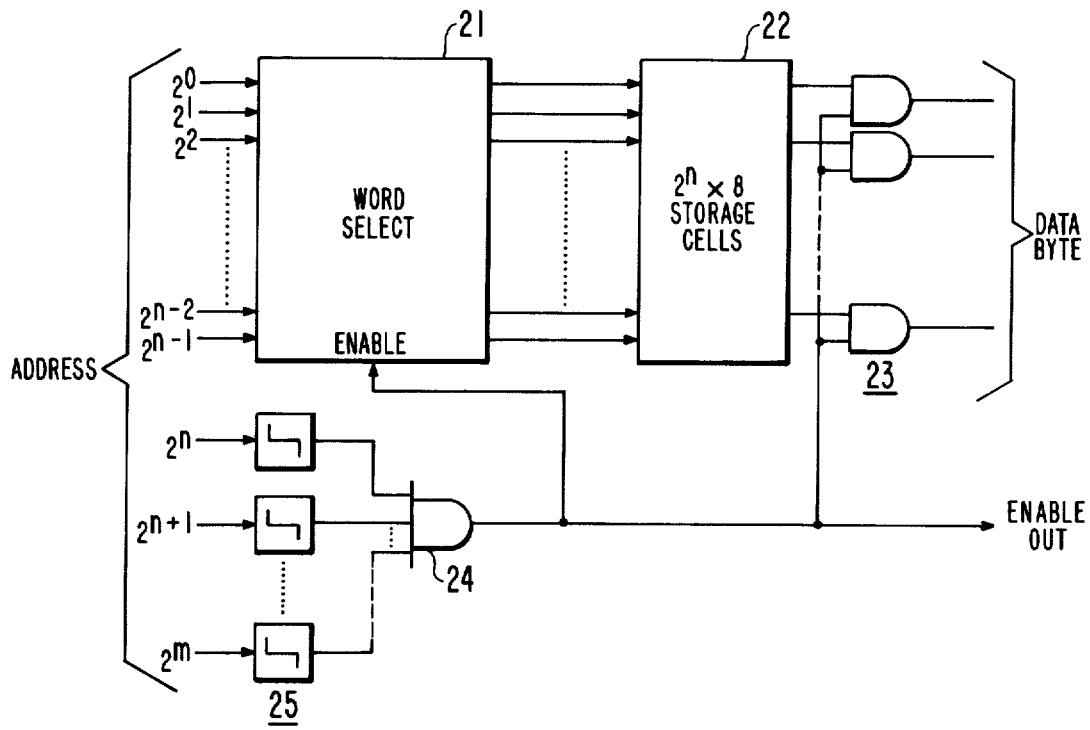
FIG. 2 is a block diagram of a Read Only Memory module according to the invention.

FIG. 2 is a block diagram of the embodiment of a module according to the invention. The module of FIG. 2 is a ROM with a word width of eight and a capacity of $2^n$ words.

The $n$ least significant (word) address lines are coupled to a word address decoder or word selector 21. The implementation of such selectors is well known in the art. The output signals from the word selector 21 selects one of the $2^n$ eight-bit bytes in a storage cell 22, the construction of which is also well known in the art. Each bit is enabled or inhibited by a separate one of a group of AND gates 23.

The $(m-n)$ most significant (block) address bits are coupled to an AND gate 24 via $(m-n)$ programmable inverters 25.

Figure 3:
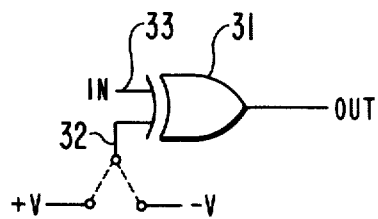
FIG. 3 is a logic diagram showing an implementation of a programmable inverter.

The adjective "programmable" refers here to the ability to change or to specify mechanically, during construction or otherwise, a given value. FIG. 3 shows a programmable inverter. An exclusive-OR gate 31 is constructed so that one of the input values can be permanently coupled to a logical one ($+V$) or to a logical zero ($-V$, reference, ground, etc.). If the input line 32 is coupled to the logical zero, the output signal will be the same logical value as the input signal on the line 33. If the input line 32 is coupled to the logical one, the output signal will be the complement (or inverse) of the input signal.

Returning to FIG. 2, the programmable inverters 25 can be constructed to decode any desired combination of $(m-n)$ high order address bits. Programming of the decoder, e.g., via the programmable inverters 25 coupled to the AND gate 24, can be accomplished when the ROM is constructed. The contents of a ROM are fixed and the contents are referenced to a specific memory location. Therefore, the construction of a ROM in accordance with FIG. 2 is feasible and cost effective.

Figure 4:
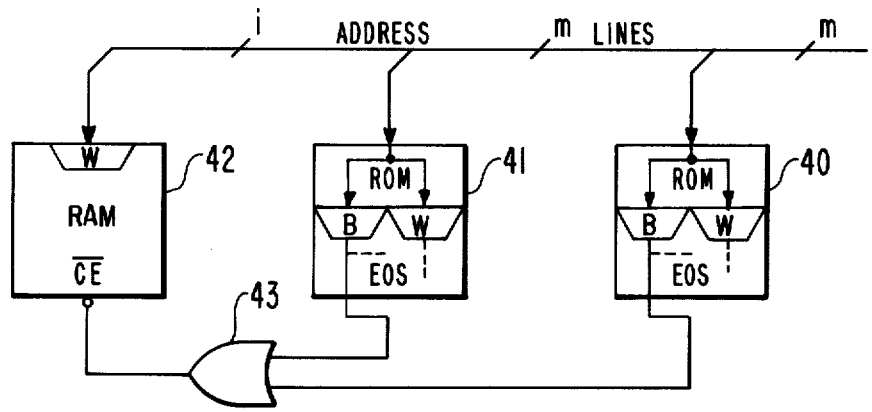
FIG. 4 is a block diagram of an embodiment of a memory system according to the invention.

FIG. 4 is an illustration of a memory system according to the invention. Two ROM's 40 and 41 receive all the address lines regardless of the capacity of the individual ROM. The ROMs 40 and 41 are presumed to be constructed in accordance with FIG. 2, the word and block portions of the address being partitioned internally according to the capacity and address locations of each ROM.

A RAM 42 has a capacity of $2^i$ memory words. Only the $i$ least significant address lines are coupled to the RAM. (The data and control lines have been omitted because they are not required for an understanding of the invention.) Instead of a decoder responsive to the $(m-i)$ most significant address lines, i.e., the block address, the enable signal is supplied by an OR gate 43. (The CE, or chip enable, signal is presumed to be a logical zero consistent with the above-cited example of a type 2102 RAM IC.)

The input signals to the OR gate 43 are the enable output signals from the ROM's 40 and 41. If either ROM 40 or 41 is being addressed, its enable output signal will be a logical one, causing the output signal from the OR gate 43 to be a logical one. The resulting logical one from the OR gate 43 disables the RAM 42 which requires a logical zero for enabling. The ROM not being addressed is inactive because its internal block address decoder is inhibited.

If neither ROM 40 nor 41 is being addressed, both enable output signals will be logical zeroes, causing the OR gate 43 output signal to be a logical zero which enables the RAM 42.

The circuit of FIG. 4 is merely illustrative of the principle of the invention. The OR gate 43 may be functionally embodied without being a separate device. For example, if the enabling output signals from the ROM's are internally coupled to the module output terminal using an emitter follower circuit, then the output terminals from the ROM's can be coupled together directly to the enable input terminal of the RAM, a technique which is sometimes referred to as phantom ORing. Similarly, the RAM 42 might be a type 2111 (Intel Corporation) which has two chip enable input signals, both requiring logical zeroes concurrently in order to activate the module. Therefore, a type 2111 RAM could be properly enabled by coupling the enabling output signals from each ROM to one of the ROM's enabling input terminals. Thus, the OR gate 43 can be implemented without using a physically distinct device so that the memory system itself consists of the memory modules only.

An advantage of the configuration according to the invention is that each word stored in the RAM can be accessed by more than one address. That is, unless the block address enables one of the ROM's, the word address will specify the location of the addressed word in the ROM independently from the block address. This allows the user greater flexibility in program addresses and permits address locations in the program to be used for constant storage, thus reducing the memory required for any specific program. It also eliminates discontinuities in allowable addresses despite the capacities of the individual ROM's or of the RAM. The physical positions of the ROM's, if pin compatible, can be interchanged without affecting the system.

The invention is not limited to memory systems employing ROM's. Some of the RAM's used in a system might be constructed with internal decoders in the same way as that described above for ROM's. Such RAM's, however, would be limited to the block address programmed therein.

The number of ROM's can be increased in a system such as that illustrated in FIG. 4 by increasing the number of input terminals of the OR gate 43. Each ROM in the system must, of course, be programmed with a different block address.

In the memory systems using more than one RAM, or a memory module without a block address decoder, some of the memory address lines can be used to select the RAM desired. Each memory address line so used reduces the total number of memory locations that can be addressed by half. This is usually not critical, but if it is, special control signals can be substituted for the address line. A special control might be implemented by using an I/O command to select the RAM to be used by the instructions following the special I/O command signal.

Figure 5:
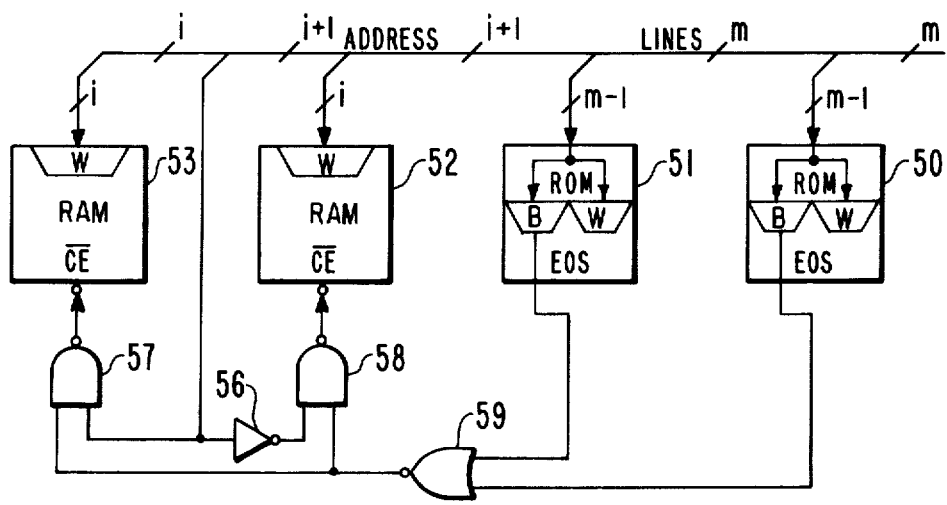
FIG. 5 is a block diagram of another embodiment of a memory system according to the invention.

In the system shown in FIG. 5, the most significant address line is used as the select control line. The $(m-1)$ low order address lines carry the address of the word to be accessed and they are coupled to the ROM's 50 and 51. The $i$ low order address lines are coupled to the RAM's 52 and 53. (The RAM's can have varying capacities, in which case the proper number of low order address lines are coupled to each RAM.)

The $m$-th address line is coupled to an inverter 56 and to a NAND gate 57. The output signal from the inverter 56 is coupled to a NAND gate 58. The other input signal to the NAND gates 57 and 58 is the output signal from a NOR gate 59. When neither of the two ROM's 50 or 51 is addressed, both input signals to the NOR gate 59 are logical zero forcing the NOR gate's output signal to a logical one. gate'logical one output signal from the NOR gate 59 primes both NAND gates 57 and 58. If the $m$-th address line is a logical zero, then the NAND gate 58 will be enabled (via the inverter 56) which in turn enables the RAM 52. If the $m$-th address line is a logical one, then the NAND gate 57 will be enabled and, consequently, the RAM 53 will be enabled.

If either of the ROM's 50 or 51 is enabled, then the corresponding logical one signal to the NOR gate 59 will produce a logical zero output signal therefrom, inhibiting the NAND gates 57 and 58 so that neither RAM 52 nor 53 will be enabled.

The principle described for the system shown in FIG. 5 can be extended to more than two RAMs. For example, the two high order address lines, $m$ and $(m-1)$, can be used to select one of four RAMs, by suitable decoding means well known in the art, when no ROM in the system is addressed.

The use of such a system may result in valid memory locations which are not contiguously addressed. Once a system is constructed, however, the usable addresses are known and can be used accordingly.

Various modifications to the systems and circuits described and illustrated to explain the concepts and modes of practicing the invention might be made by those of ordinary skill in the art within the principles or scope of the invention as expressed in the appended claims.

What is claimed is:

1. In a memory system comprising a plurality of memory module means for storing blocks of data, each memory module means including word address decoding means for selecting a word stored in said memory module means and enabling means for reading out from said memory modules means the word selected by said word address decoding means, the improvement comprising:

a separate block address decoding means included in each one of said plurality less one of said memory module means for producing an output signal to the enabling means of its associated memory module means;

means responsive to the output signals from said block address decoding means for producing a select signal when none of said plurality less one of said memory module means is enabled; and means for coupling said select signal to the enabling means of said one of said memory module means to enable said one of the memory module means when none of said plurality less one of said memory module means when none of said plurality less one of said memory module means is enabled.

2. In a memory system including $m$ address line means partitioned into $k$ select line means, $n$ block address line means, and $w$ word address line means, where $k + n + w = m$, a first plurality of memory module means, including block address decoder means responsive to said $n$ block address line means for enabling an addressed one of said first plurality of memory module means and word address decoder means responsive to at least a subset of said $w$ word address line means for selecting a word location within one of said first plurality of memory module means, for storing data, the improvement comprising:

means included in said first plurality of memory module means, responsive to said block address decoder means, for producing enabled output signals when one of said first plurality of memory module means is enabled;

a second plurality of memory module means each having an enabling input means and word address decoder means responsive to at least a subset of said $w$ word address line means for selecting a word location therein, for storing data; and activating means responsive to said $k$ select line means and to said enabled output signals for supplying an enabling signal to the enabling input means of one of said second plurality of memory module means when none of said first plurality of memory module means is addressed.

3. The invention as claimed in claim 2 wherein said activating means includes:

decoding means, having at least $2^k$ output lines, responsive to said $k$ select line means for producing a select signal on one of said $2^k$ output lines;

first gating means responsive to said enabled output signals from the first plurality of memory module means for producing an output signal when none of said first plurality of memory module means is addressed; and second gating means, each having an output means coupled to the enabling input means of a different one of said second plurality of memory module means and responsive to a different one of said $2^k$ output lines and to the output signal from said first gating means for producing an enabling signal to the enabling input means of a corresponding one of said second plurality of memory module means.

* * * * *

UNITED STATES PATENT OFFICE
CERTIFICATE OF CORRECTION

PATENT NO. : 4,040,029

DATED : August 2, 1977

INVENTOR(S) : Alexander Wilson Young

It is certified that error appears in the above-identified patent and that said Letters Patent are hereby corrected as shown below:

Column 4, line 31, "ROM's" should read --RAM's--.

Column 4, line 40, "ROM" should read --RAM--.

Column 5, line 19, "gate'logical" should read --The logical--.

Column 6, line 11, delete "when none of said plurality less one of".

Column 6, line 12, delete "said memory module means".

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*